(12) United States Patent
Brett

(10) Patent No.: US 6,400,541 B1
(45) Date of Patent: Jun. 4, 2002

(54) CIRCUIT FOR PROTECTION OF DIFFERENTIAL INPUTS AGAINST ELECTROSTATIC DISCHARGE

(75) Inventor: Stephen Jonathan Brett, Hailsham (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/541,872

(22) Filed: Apr. 3, 2000

Related U.S. Application Data

(60) Provisional application No. 60/161,801, filed on Oct. 27, 1999.

(51) Int. Cl.[7] .................................................. H02H 9/00
(52) U.S. Cl. ...................... 361/56; 361/91.5; 330/207 P
(58) Field of Search .......................... 361/111, 56, 91.1, 361/91.5; 330/207 P, 298

(56) References Cited

U.S. PATENT DOCUMENTS

| | | | |
|---|---|---|---|
| 3,879,640 A | 4/1975 | Schade, Jr. .................... 317/31 |
| 4,044,313 A | 8/1977 | Wittlinger et al. ......... 330/207 P |
| 4,158,863 A | * 6/1979 | Naylor .......................... 361/56 |
| 4,440,980 A | * 4/1984 | Bakker ........................ 379/395 |
| 5,764,464 A | * 6/1998 | Botker et al. ................. 361/56 |
| 5,862,031 A | 1/1999 | Wicker et al. ............... 361/111 |
| 5,905,617 A | * 5/1999 | Kawasoe ...................... 361/86 |

FOREIGN PATENT DOCUMENTS

| | | |
|---|---|---|
| EP | 0 631 318 A1 | 12/1994 |
| GB | 2 008 357 A | 5/1979 |
| JP | 02 246613 | 10/1990 |

* cited by examiner

*Primary Examiner*—Michael J. Sherry
(74) *Attorney, Agent, or Firm*—Wolf, Greenfield & Sacks, P.C.

(57) ABSTRACT

A circuit protects differential inputs of circuitry, such as RF circuitry, against electrostatic discharge. The circuit includes first and second diodes connected in opposite directions between a first differential input pin and a virtual ground node, third and fourth diodes connected in opposite directions between a second differential input pin and the virtual ground node, a first protection device connected between the virtual ground node and a first external pin, such as a positive supply pin, and a second protection device connected between the virtual ground node and a second external pin, such as a negative supply pin. The first and second protection devices may be fifth and sixth diodes, respectively. Because no signal appears at the virtual ground node, the fifth and sixth diodes can be relatively large.

22 Claims, 6 Drawing Sheets

CIRCUIT FOR PROTECTION OF DIFFERENTIAL INPUTS AGAINST ELECTROSTATIC DISCHARGE

CROSS REFERENCE TO RELATED APPLICATION

This application claims the benefit of provisional application Ser. No. 60/161,801 filed Oct. 27, 1999.

FIELD OF THE INVENTION

This invention relates to circuitry for protection of sensitive circuitry against electrostatic discharge and, more particularly, to protection circuits for protection of differential inputs, such as differential RF inputs.

BACKGROUND OF THE INVENTION

The inputs to semiconductor circuits are vulnerable to damage or destruction by electrostatic discharge (ESD). Although protection circuits have been utilized in the prior art, the protection of radio frequency (RF) circuits against electrostatic discharge is particularly difficult. Protection circuits may involve the connection of diodes between the RF inputs and ground. The diodes are biased into conduction by an electrostatic discharge and thereby prevent the application of high voltages to the sensitive RF circuit. Such RF inputs may be connected to the front end of a low noise receiver for receiving very low level signals, and capacitance added by the protection circuit degrades RF performance. An example of such an RF circuit is the receiver in a mobile telephone. Thus, the challenge in developing protection circuits for RF circuitry is to provide adequate protection against electrostatic discharge without producing an unacceptable degradation in performance.

One prior art protection circuit is shown in FIG. 5. A differential amplifier includes bipolar transistors 10, 12 and 14. Differential inputs IP and IPB are connected to the bases of transistors 10 and 14, respectively. A diode 20 is connected between the base and emitter of transistor 10, and a diode 22 is connected between the base and emitter of transistor 14. For small signals, node 24, the common emitter of transistors 10 and 14, acts as a virtual ground. The base-emitter junctions of transistors 10 and 14 provide a nondestructive discharge path for ESD events, and diodes 20 and 22 provide additional protection against ESD events. This circuit provides limited protection against ESD events involving the supply pins. In addition, its use is limited to circuits which employ bipolar transistors at the inputs.

A widely used prior art protection circuit is shown in FIG. 6. Diodes 30–36 are connected between differential inputs IP and IPB, and diodes 40–46 are connected between the differential inputs and the power supply pins VCC and VEE. The protection circuit shown in FIG. 6 is limited to use with low frequency signals because of the large capacitive loading imposed by diodes 40–46. Reducing the sizes of the diodes 40–46 reduces the effectiveness of the ESD protection.

An ESD protection circuit for integrated circuits having a bipolar differential input is disclosed in U.S. Pat. No. 5,862, 031 issued Jan. 19, 1999 to Wicker et al.

Because known protection circuits capacitively load RF inputs, RF inputs are often left unprotected and vulnerable to damage. Accordingly, there is a need for improved circuits for protection of differential inputs against electrostatic discharge.

SUMMARY OF THE INVENTION

According to a first aspect of the invention, a circuit is provided for protection of differential inputs of circuitry against electrostatic discharge. The circuit comprises first and second diodes connected in opposite directions between a first differential input pin and a virtual ground node, third and fourth diodes connected in opposite directions between a second differential input pin and the virtual ground node, a first protection device connected between the virtual ground node and a first external pin, and a second protection device connected between the virtual ground node and a second external pin.

The first and second protection devices may comprise fifth and sixth diodes, respectively. In a preferred embodiment, each of the fifth and sixth diodes is larger than each of the first, second, third and fourth diodes. Preferably, the first, second, third and fourth diodes are matched. The first external pin may comprise a positive supply pin, and the second external pin may comprise a negative supply pin or a circuit ground pin.

In one embodiment, each of the first, second, third and fourth diodes is implemented as a collector-base junction of a transistor. In another embodiment, the first diode comprises the base-emitter junction of a first transistor of a differential pair, the third diode comprises a base-emitter junction of a second transistor of the differential pair, and the virtual ground node is a common emitter of the differential pair.

According to another aspect of the invention, a method is provided for protecting differential inputs of circuitry against electrostatic discharge. The method comprises the steps of (a) providing a first discharge path between a first differential input pin and a virtual ground node, (b) providing a second discharge path between a second differential input pin and the virtual ground node, (c) providing a third discharge path between the virtual ground node and a first external pin, and (d) providing a fourth discharge path between the virtual ground node and a second external pin. Preferably, the first and second discharge paths are bidirectional.

According to a further aspect of the invention, a circuit is provided for protection of differential inputs of circuitry against electrostatic discharge. The circuit comprises first and second diodes connected in opposite directions between a first differential input pin and a virtual ground node, third and fourth diodes connected in opposite directions between a second differential input pin and the virtual ground node, and a protection device connected between the virtual ground node and an external pin.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
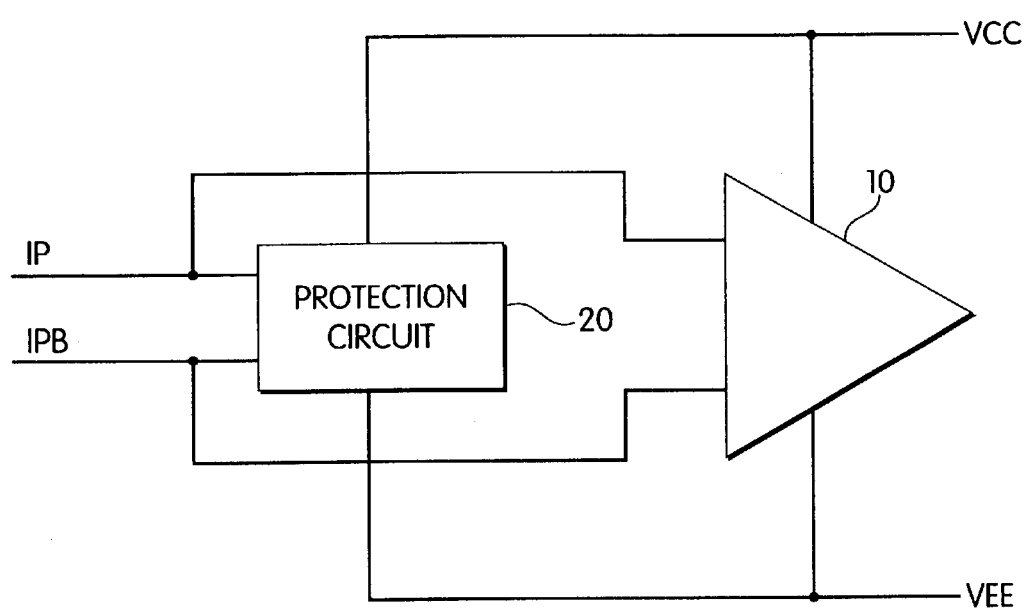
FIG. 1 is a block diagram of an example of circuitry incorporating a protection circuit in accordance with the present invention.

A block diagram of circuitry incorporating a protection circuit in accordance with the invention is shown in FIG. 1. A circuit 10 has differential input pins IP and IPB, and receives supply voltages at supply pins VCC and VEE. Circuit 10 is typically an RF integrated circuit. However, the protection circuit of the present invention may be utilized with other circuits having differential inputs. Typically, a positive voltage is applied to supply pin VCC, and a negative voltage or circuit ground is applied to supply pin VEE. In a typical application, circuit 10 supplies outputs to additional circuitry on the same integrated circuit chip or on another integrated circuit chip. In one example, circuit 10 is a low noise amplifier at the input of a mobile telephone receiver. Input pins IP and IPB may be connected to a bandpass filter, which in turn is connected to an antenna.

A protection circuit 20 receives differential inputs at input pins IP and IPB and is connected to supply pins VCC and VEE. A purpose of protection circuit 20 is to protect the differential inputs of circuit 10 against ESD events occurring on any combination of differential input pins IP and IPB, and supply pins VCC and VEE. Differential input pins IP and IPB, and supply pins VCC and VEE are external pins of an integrated circuit.

Figure 2:
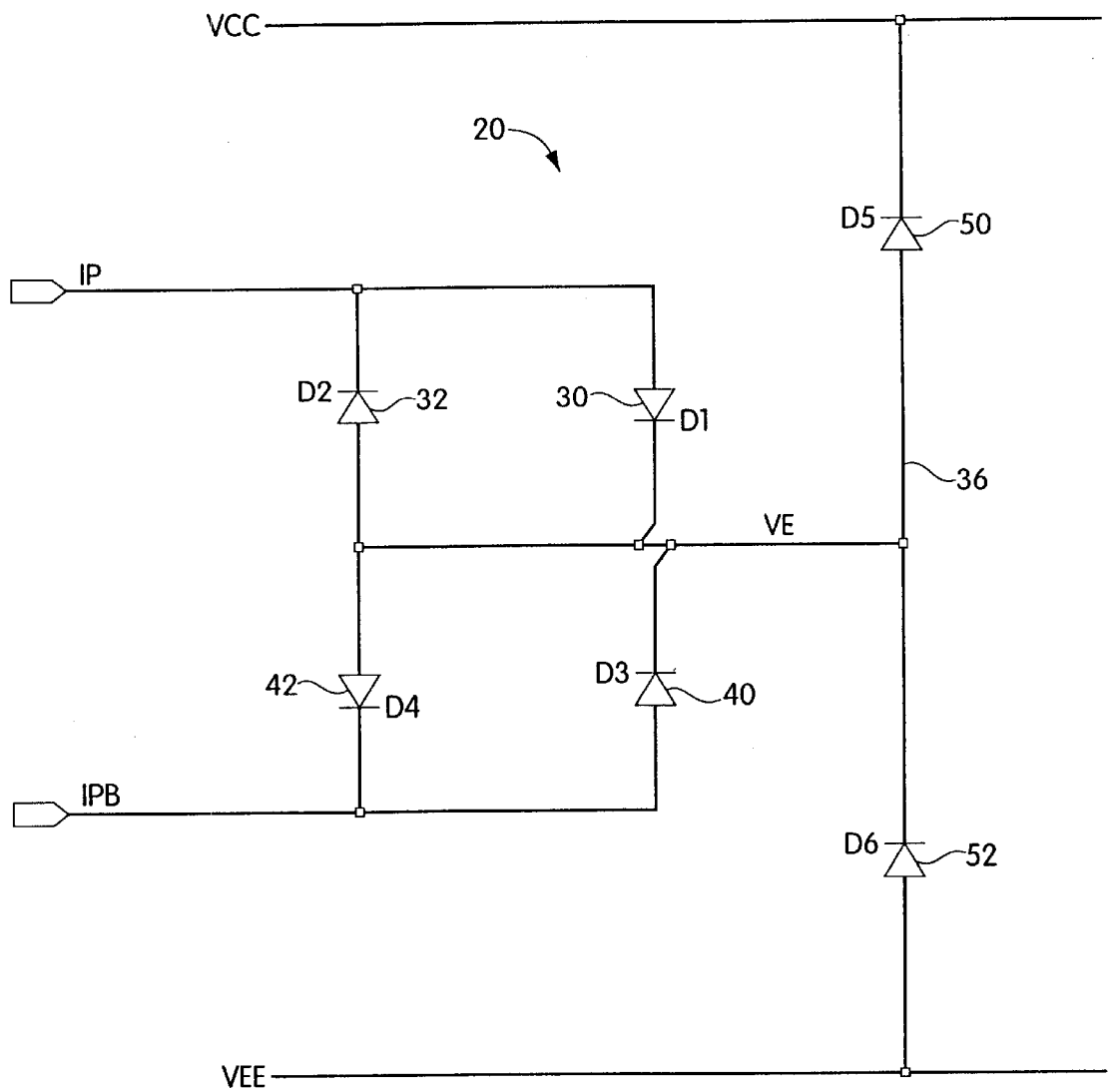
FIG. 2 is a schematic diagram of an example of a protection circuit in accordance with the present invention.

A schematic diagram of an example of protection circuit 20 in accordance with the invention is shown in FIG. 2. Diodes 30 and 32 are connected in opposite directions between input pin IP and a virtual ground node 36. Diodes 40 and 42 are connected in opposite directions between input pin IPB and virtual ground node 36. Input pins IP and IPB together form a differential input, and the differential input signals applied to input pins IP and IPB are of opposite phase. The cathodes of diodes 30 and 40 are connected to virtual ground node 36, the cathode of diode 32 is connected to differential input pin IP, and the cathode of diode 42 is connected to differential input pin IPB. A diode 50 is connected between virtual ground node 36 and positive supply pin VCC, with the cathode of diode 50 connected to supply pin VCC. A diode 52 is connected between virtual ground node 36 and negative supply pin VEE, with the cathode of diode 52 connected to virtual ground node 36.

The protection circuit 20 shown in FIG. 2 provides bidirectional ESD protection between differential input pins IP and IPB and from each input pin to each supply pin. Preferably, diodes 30, 32, 40 and 42 are relatively small diodes, and diodes 50 and 52 are relatively large. The four small diodes 30, 32, 40 and 42 provide bidirectional discharge paths from differential input pins IP and IPB to the virtual ground node 36, and the two large diodes 50 and 52 provide bidirectional discharge paths from the virtual ground node 36 to the positive and negative supply pins VCC and VEE. In general, the protection circuit provides a discharge path for each ESD event, which is lower in impedance than the protected circuit.

The discharge paths for all possible ESD events involving input pin IP are shown in Table 1 below. An "R" following the diode reference numeral indicates that the discharge path is through the breakdown of a reverse-biased diode. All other paths are through a forward-biased diode. By symmetry, similar paths exist for all ESD events involving input in IPB.

TABLE 1

| ESD Event Between pins: | | |
|---|---|---|
| +ve | −ve | Discharge Path |
| IP | IPB | Diodes 30 + 42 |
| IP | VEE | Diodes 30 + 52R |
| VEE | IP | Diodes 52 + 32 |
| IP | VCC | Diodes 30 + 50 |
| VCC | IP | Diodes 32 + 50R |

Diodes 30, 32, 40 and 42 are never reverse biased by more than their forward conduction voltage. Diodes 50 and 52 should have a reverse breakdown voltage which is as small as possible, while still exceeding the maximum required supply voltage of the circuit by a reasonable safety margin. The breakdown mode of diodes 50 and 52 must also be such that no damage to the junction is caused by an ESD event. These requirements are common for ESD protection devices and can usually be met by one or more junctions in a given process. The design of the protection circuit 20 must take into account any common mode voltage that appears at input pins IP and IPB during normal operation and must ensure that diodes 50 and 52 are reverse biased and that the reverse bias does not exceed the breakdown voltage of diodes 50 and 52.

For any balanced differential input signal at input pins IP and IPB, node 36 is a virtual ground, and no signal voltage appears on node 36. Thus, diodes 50 and 52 can be made very large. Since any parasitic capacitance is connected to the virtual ground, no current flows into that capacitance, and it cannot load the inputs. The size of diodes 50 and 52 is normally limited by layout considerations. One advantage of the protection circuit shown in FIG. 2 is that one pair of large diodes 50 and 52 is shared between two inputs, so the circuit is space efficient.

The degree of ESD protection afforded by the protection circuit is limited by the size of diodes 30, 32, 40 and 42. The parasitic capacitance of these diodes loads the inputs, so their size is determined by a compromise between the required protection and the required RF performance. Normally, diodes 30, 32, 40 and 42 are much smaller than diodes 50 and 52.

The protection circuit 20 shown in FIG. 2 and described above utilizes two diodes 50 and 52 connected between virtual ground node 36 and positive and negative supply pins VCC and VEE, respectively. In general, the protection circuit of the invention may utilize one or more diodes or other ESD protection devices, each connected between the virtual ground node and an external pin of the integrated circuit or other electronic circuit. While the external pins are supply pins in the example of FIG. 2, the protection circuit may be utilized to protect any external pin against ESD events. The connections to the external pins are preferably direct connections, but may also be connections through one or more electrical components, such as resistors.

Figure 3:
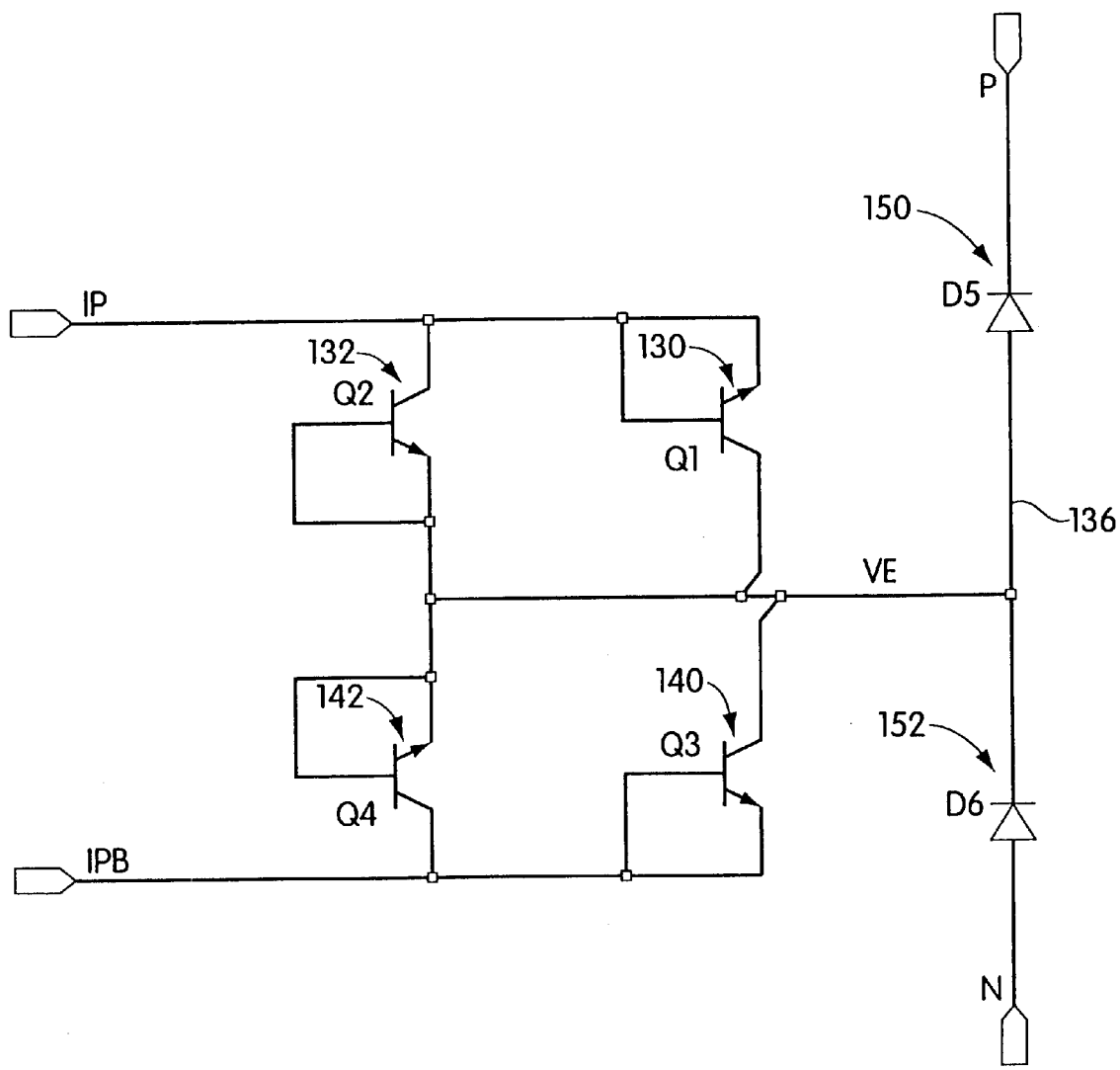
FIG. 3 is a schematic diagram of a first example of an implementation of the protection circuit of the present invention.

A schematic diagram of a preferred implementation of the protection circuit is shown in FIG. 3. Diodes 30, 32, 40 and 42 of FIG. 2 are implemented using the collector-base junctions of NPN transistors 130, 132, 140 and 142, respectively. These transistors are single emitter, single base contact devices chosen for optimum metalization and the lowest collector-base impedance for a given CJC (parasitic capacitance of collector-base junction) and CJS (parasitic capacitance of collector-substrate junction). Input pin IP is loaded by the CJS and CJC of transistor 132 and the CJC of transistor 130. Similarly, input pin IPB is loaded by the CJS and CJC of transistor 142 and the CJC of transistor 140. Diodes 150 and 152 may be any ESD protection diodes or devices, and should be as large as is practical.

Figure 4:
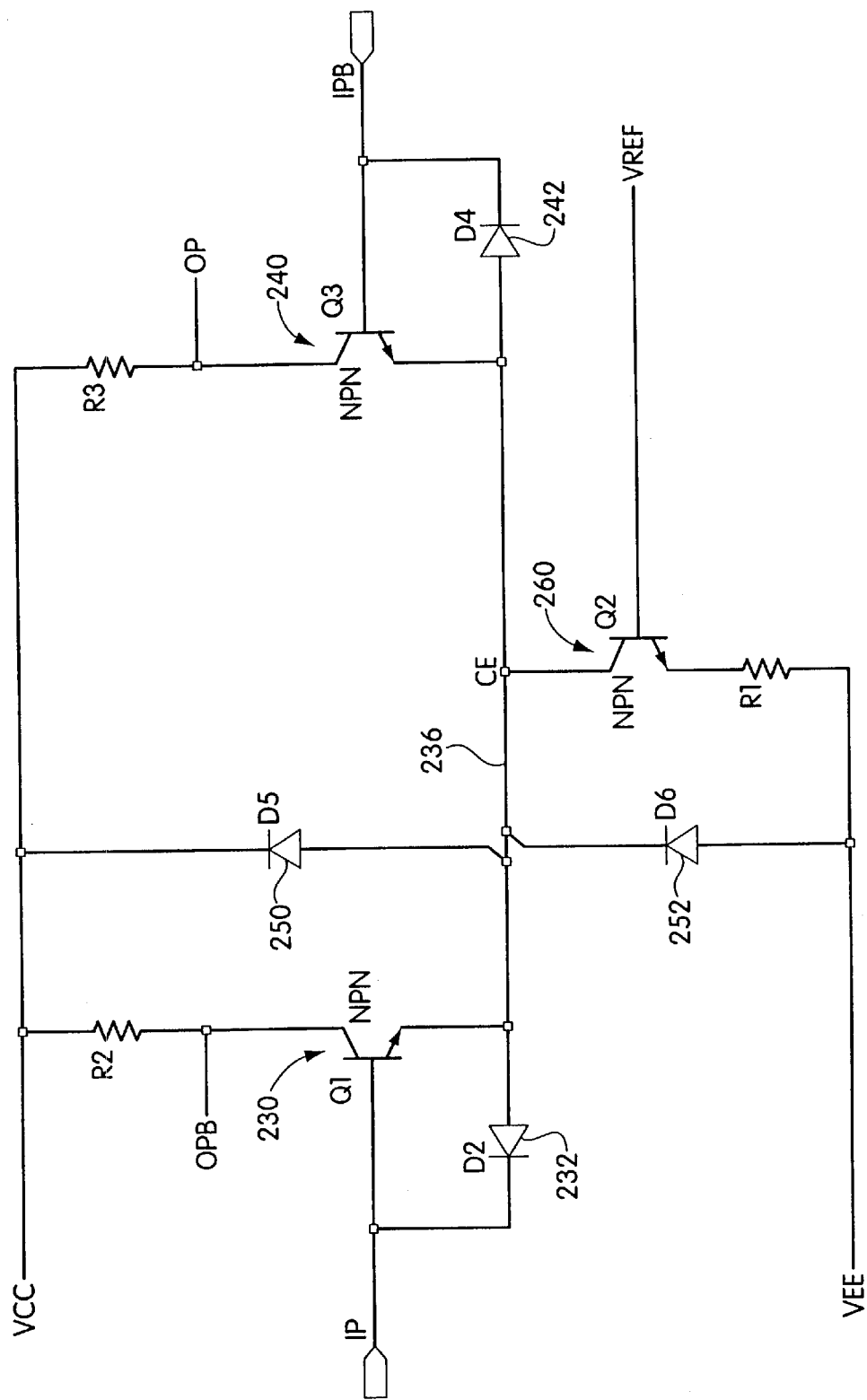
FIG. 4 is a schematic diagram of a second example of an implementation of the protection circuit of the present invention.
Figure 5:
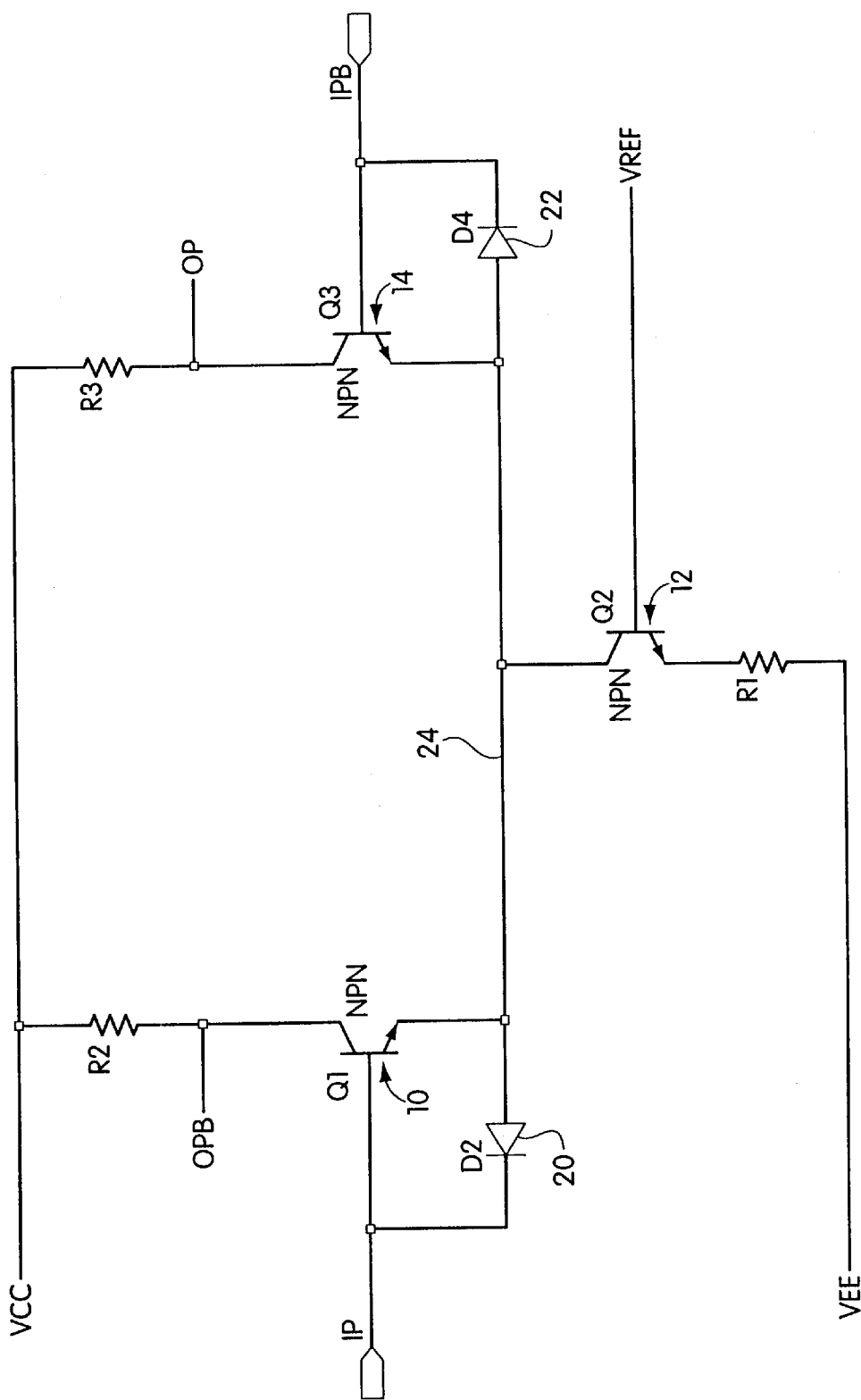
FIG. 5 i s a schematic diagram of a first prior art protection circuit.
Figure 6:
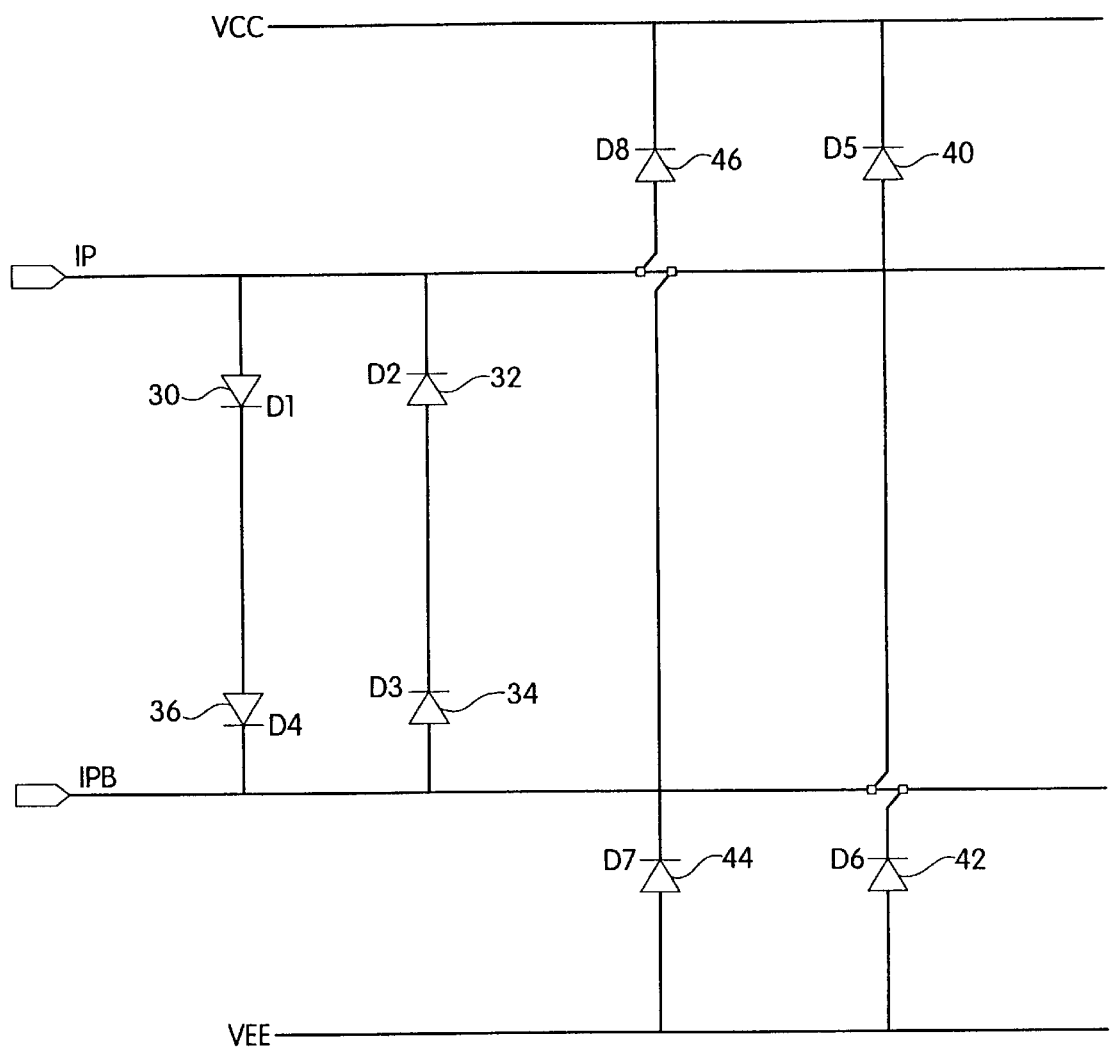
FIG. 6 is a schematic diagram of a second prior art protection circuit.

A schematic diagram of an alternative implementation for bipolar differential inputs is shown in FIG. 4. A differential amplifier circuit includes NPN input transistors 230 and 240, and a current source transistor 260. A diode 232 is connected between an input pin IP and a common emitter node 236 of transistors 230 and 240. A diode 242 is connected between an input pin IPB and common emitter node 236. Input pins IP and IPB together form a differential input, and the differential input signals applied to input pins IP and IPB are of opposite phase. A diode 250 is connected between common emitter node 236 and supply pin VCC, and a diode 252 is connected between common emitter node 236 and supply pin VEE.

In the circuit of FIG. 4, the emitter-base junctions of transistors 230 and 240 function as ESD protection diodes. Comparing the circuit of FIG. 4 to the circuit of FIG. 2, the emitter-base junction of transistor 230 corresponds to diode 30; diode 232 corresponds to diode 32; the emitter-base junction of transistor 240 corresponds to diode 40; diode 242 corresponds to diode 42; diode 250 corresponds to diode 50; and diode 252 corresponds to diode 52. The common emitter node 236 is a virtual ground for small input signals, but for large inputs some signal appears on node 236 due to the nonlinear nature of the emitter-base junction. Therefore, this implementation is less effective than the implementation of FIG. 3, and the parasitic capacitance of diodes 250 and 252 causes some loading.

Other implementations include replacement of diodes 50 and 52 in FIG. 2 with other devices, such as SCRs, or replacing each of diodes 30, 32, 40 and 42 with multiple diodes to increase the allowed input range. In the embodiment of FIG. 2, the voltage between input pins IP and IPB is limited to the voltage of two forward biased diodes.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A circuit for protection of differential inputs of circuitry against electrostatic discharge, comprising:

first and second diodes connected in opposite directions between a first differential input pin and a virtual ground node;

third and fourth diodes connected in opposite directions between a second differential input pin and the virtual ground node;

a first protection device connected between the virtual ground node and a first external pin; and a second protection device connected between the virtual ground node and a second external pin.

2. A protection circuit as defined in claim 1 wherein said first and second protection devices comprise fifth and sixth diodes, respectively.

3. A protection circuit as defined in claim 2 wherein each of said fifth and sixth diodes is larger than each of said first, second, third and fourth diodes.

4. A protection circuit as defined in claim 1 wherein said first, second, third and fourth diodes are substantially matched.

5. A protection circuit as defined in claim 1 wherein said first external pin comprises a positive supply pin.

6. A protection circuit as defined in claim 5 wherein said second external pin comprises a negative supply pin.

7. A protection circuit as defined in claim 5 wherein said second external pin comprises a circuit ground pin.

8. A protection circuit as defined in claim 1 wherein each of said first, second, third and fourth diodes is implemented as a collector-base junction of a transistor.

9. A protection circuit as defined in claim 1 wherein said first diode comprises the base-emitter junction of a first transistor of a differential pair, said third diode comprises a base-emitter junction of a second transistor of the differential pair and wherein the virtual ground node is a common emitter of the differential pair.

10. A method for protecting differential inputs of circuitry against electrostatic discharge, comprising the steps of:

(a) providing a first discharge path between a first differential input pin and a virtual ground node;

(b) providing a second discharge path between a second differential input pin and the virtual ground node;

(c) providing a third discharge path between the virtual ground node and a first external pin; and (d) providing a fourth discharge path between the virtual ground node and a second external pin.

11. A method as defined in claim 10 wherein:

step (a) comprises providing first and second diodes connected in opposite directions between the first differential input pin and the virtual ground node;

step (b) comprises providing third and fourth diodes connected in opposite directions between the second differential input pin and the virtual ground node;

step (c) comprises providing a first protection device connected between the virtual ground node and the first external pin; and step (d) comprises providing a second protection device connected between the virtual ground node and the second external pin.

12. A method as defined in claim 11 wherein step (c) comprises connecting said first protection device between the virtual ground node and a positive supply pin, and wherein step (d) comprises connecting said second protection device between the virtual ground node and a negative supply pin.

13. A method as defined in claim 11 wherein step (c) comprises providing a fifth diode and step (d) comprises providing a sixth diode.

14. A method as defined in claim 10 wherein step (a) comprises providing a first bidirectional discharge path and wherein step (b) comprises providing a second bidirectional discharge path.

15. Apparatus for protection of differential inputs of circuitry against electrostatic discharge, comprising:

means for providing a first discharge path between a first differential input pin of said circuitry and a virtual ground node;

means for providing a second discharge path between a second differential input pin of said circuitry and the virtual ground node;

means for providing a third discharge path between the virtual ground node and a first external pin; and means for providing a fourth discharge path between the virtual ground node and a second external pin.

16. Apparatus as defined in claim 15 wherein said means for providing a first discharge path comprises first and second diodes connected in opposite directions between the first differential input pin and the virtual ground node, said means for providing a second discharge path comprises third and fourth diodes connected in opposite directions between the second differential input pin and the virtual ground node, said means for providing a third discharge path comprises a first protection device connected between the virtual ground node and the first external pin, and said means for providing a fourth discharge path comprises a second protection device connected between the virtual ground node and the second external pin.

17. Apparatus as defined in claim 16 wherein each of said first, second, third and fourth diodes is implemented as a collector-base junction of a transistor.

18. Apparatus as defined in claim 16 wherein said first and second protection devices comprise fifth and sixth diodes, respectively.

19. Apparatus as defined in claim 15 wherein said first external pin comprises a positive supply pin and wherein said second external pin comprises a negative supply pin or a circuit ground pin.

20. Apparatus as defined in claim 15 wherein said first and second discharge paths comprise bidirectional discharge paths.

21. A circuit for protection of differential inputs of circuitry against electrostatic discharge, comprising:

first and second diodes connected in opposite directions between a first differential input pin and a virtual ground node;

third and fourth diodes connected in opposite directions between a second differential input pin and a virtual ground node; and an electrostatic discharge protection device connected between the virtual ground node and an external pin.

22. A protection circuit as defined in claim 21 wherein said protection device comprises a fifth diode.

* * * * *